United States Patent

Yanashima et al.

[11] Patent Number: 5,993,542
[45] Date of Patent: Nov. 30, 1999

[54] METHOD FOR GROWING NITRIDE III-V COMPOUND SEMICONDUCTOR LAYERS AND METHOD FOR FABRICATING A NITRIDE III-V COMPOUND SEMICONDUCTOR SUBSTRATE

[75] Inventors: Katsunori Yanashima; Masao Ikeda; Satoshi Tomioka, all of Kanagawa, Japan

[73] Assignee: Sony Corporation, Tokyo, Japan

[21] Appl. No.: 08/985,313

[22] Filed: Dec. 4, 1997

[30] Foreign Application Priority Data

Dec. 5, 1996 [JP] Japan ................................. 8-325260

[51] Int. Cl.$^6$ .................................................. C30B 23/00
[52] U.S. Cl. .......................... 117/84; 117/104; 117/105; 117/108; 117/952; 438/46
[58] Field of Search ................................ 117/88, 89, 92, 117/93, 95, 104, 952, 84, 105, 108; 438/46

[56] References Cited

U.S. PATENT DOCUMENTS

| | | |
|---|---|---|
| 4,911,102 | 3/1990 | Manabe et al. .......................... 118/719 |
| 5,122,845 | 6/1992 | Manabe et al. ............................ 257/76 |
| 5,290,393 | 3/1994 | Nakamura ................................ 438/509 |
| 5,602,418 | 2/1997 | Imai et al. ................................ 257/627 |
| 5,633,192 | 5/1997 | Moustakas et al. ....................... 438/46 |
| 5,637,531 | 6/1997 | Porowski et al. ......................... 117/89 |
| 5,843,590 | 12/1998 | Miura et al. ............................. 428/698 |

FOREIGN PATENT DOCUMENTS

| | | |
|---|---|---|
| 0 497 350 A1 | 8/1992 | European Pat. Off. . |
| 0 711 853 A1 | 5/1996 | European Pat. Off. . |
| 4006449 A1 | 9/1990 | Germany . |

*Primary Examiner*—Felisa Hiteshew
*Assistant Examiner*—Donald L. Champagne
*Attorney, Agent, or Firm*—Hill & Simpson

[57] ABSTRACT

A method for fabricating nitride III–V compound semiconductor layers of substrate, of GaN for example, comprises the steps of: growing a first $B_wAl_xGa_yIn_zN$ layer 2 (where $0 \leq w \leq 1$, $0 \leq x \leq 1$, $0 \leq y \leq 1$, $0 \leq y \leq 1$ and $w+x+y+z=1$) on a sacrificial sapphire substrate 1 by MOCVD at a growth rate not higher than 4 μm/h; growing a second $B_wAl_xGa_yIn_zN$ layer 3 (where $0 \leq w \leq 1$, $0 \leq x \leq 1$, $0 \leq y \leq 1$, $0 \leq y \leq 1$ and $w+x+y+z=1$) on the first $B_wAl_xGa_yIn_zN$ layer by hydride VPE at a growth rate higher than 4 μm/h and not higher than 200 μm/h; and removing the sacrificial substrate 1.

23 Claims, 7 Drawing Sheets

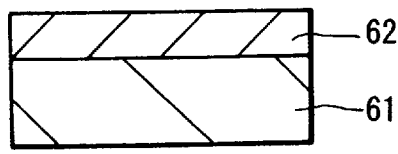
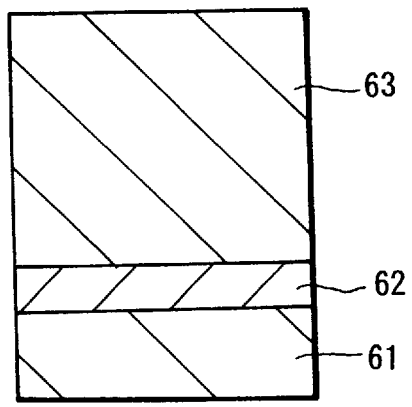
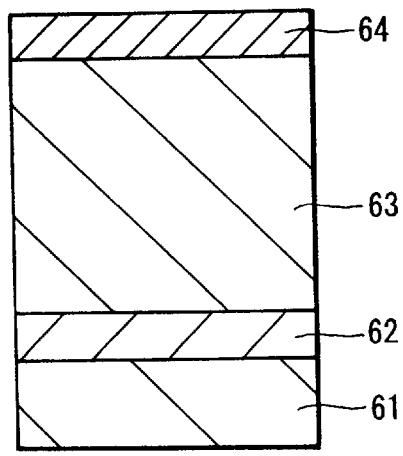
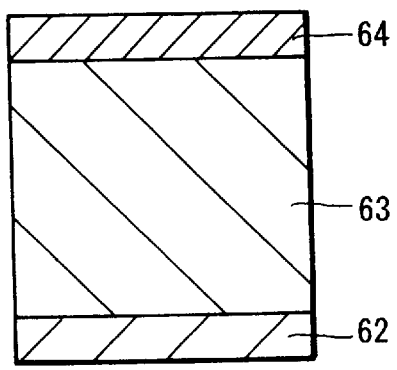
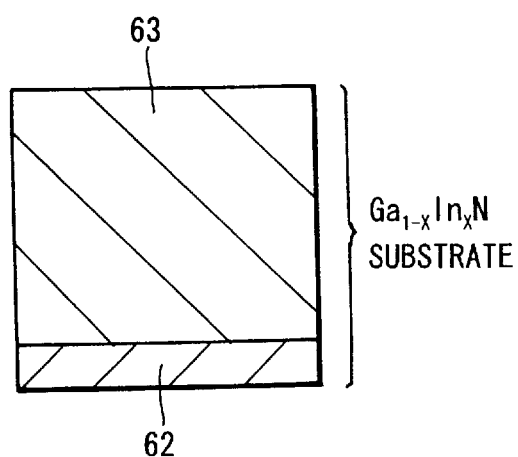

METHOD FOR GROWING NITRIDE III-V COMPOUND SEMICONDUCTOR LAYERS AND METHOD FOR FABRICATING A NITRIDE III-V COMPOUND SEMICONDUCTOR SUBSTRATE

BACKGROUND OF THE INVENTION

1. Field of the Invention

This invention relates to a method for growing nitride III–V compound semiconductor layers and a method for fabricating a nitride III–V compound semiconductor substrate and, in particular, to those suitable for use in a semiconductor device, such as semiconductor laser, using nitride III–V compound semiconductors.

2. Description of the Related Art

Recently, there is a strong demand for development of semiconductor lasers for emitting green, blue or ultraviolet light with a short wavelength, derived from the demand for optical discs and magneto-optical discs permitting higher recording and reproducing densities and higher resolutions.

Nitride III–V compound semiconductors represented by GaN, AlGaN and GaInN are known as appropriate materials for fabricating semiconductor devices capable of emitting short-wavelength light (for example, Jpn. J. Appl. Phys. 30(1991) L1998).

Growth of nitride III–V compound semiconductor layers conventionally relies on metal organic chemical vapor deposition (MOCVD) and molecular beam epitaxy (MBE), and uses a sapphire ($Al_2O_3$) substrate or a silicon carbide (SiC) substrate as the growth substrate.

However, nitride III–V compound semiconductor layers grown on a sapphire substrate or a silicon carbide substrate are liable to contain defects or to crack due to a difference from the substrate in lattice constant and thermal expansion coefficient. Additionally, when a semiconductor laser is fabricated by stacking nitride III–V compound semiconductor layers by growth on a sapphire substrate or a silicon carbide substrate, it is difficult to make its cavity end surface by cleavage.

These problems will be solved if a nitride III–V compound semiconductor substrate is obtained. That is, nitride III–V compound semiconductor layers grown on a nitride III–V compound semiconductor substrate eliminate the problems of defects or cracking because their lattice constant and thermal expansion coefficient coincide with those of the substrate. Also when a semiconductor laser, for example, is fabricated, its cavity end surface can be made by cleavage. In addition to these advantages, the use of a nitride III–V compound semiconductor substrate enables an electrode to be made on the bottom surface of the substrate, and therefore enables high-yield production of highly reliable semiconductor devices, e.g. semiconductor lasers.

However, since the vapor pressure of nitrogen is high, none of typical methods for preparing Si substrates or GaAs substrate can be used for fabricating nitride III–V compound semiconductor substrates.

In addition to MOCVD and MBE, hydride vapor phase epitaxy (VPE) is also known as a method for growing GaN. Hydride VPE can grow a GaN layer as thick as several micrometers to hundreds of micrometers per hour and is considered one of most effective methods for manufacturing GaN substrates. Regarding fabrication of GaN substrates, there is a report that GaN layers were grown on sapphire substrates, GaAs substrates, and so on, by hydride VPE. These GaN substrates, however, do not have satisfactory qualities for use as substrates, due to unacceptable crystallographic properties or surface conditions, or their GaN layers being grown diagonally, and not normally, with respect to the substrates.

OBJECTS AND SUMMARY OF THE INVENTION

It is therefore an object of the invention to provide a method for growing a nitride III–V compound semiconductor layer and a method for fabricating a nitride III–V compound semiconductor substrate which can promise a high productivity of nitride III–V compound semiconductor substrates having an excellent quality with a good crystallographic property and no surface roughness or cracks.

The Inventor made all efforts to attain the object, and found it effective, for a high productivity of high-quality nitride III–V compound semiconductor substrates with a good crystallographic property and no surface roughness or cracks, to first grow a thin nitride III–V compound semiconductor layer on a sapphire substrate, for example, typically used for this purpose, at a growth rate low enough to prevent surface roughness or cracks and to thereafter grow a thick nitride III–V compound semiconductor layer on the thin layer at a higher growth rate. The present invention is based on the knowledge.

According to a first aspect of the invention, there is provided a method for growing nitride III–V compound semiconductor layers, comprising the steps of:

growing a first $B_wAl_xGa_yIn_zN$ layer (where $0 \leq w \leq 1$, $0 \leq x \leq 1$, $0 \leq y \leq 1$, $0 \leq y \leq 1$ and $w+x+y+z=1$) on a substrate by first vapor deposition at a growth rate not higher than 4 $\mu$m/h; and growing a second $B_wAl_xGa_yIn_zN$ layer (where $0 \leq w \leq 1$, $0 \leq x \leq 1$, $0 \leq y \leq 1$, $0 \leq y \leq 1$ and $w+x+y+z=1$) on the first $B_wAl_xGa_yIn_zN$ layer by second vapor deposition at a growth rate higher than 4 $\mu$m/h and not higher than 200 $\mu$m/h.

According to a second aspect of the invention, there is provided a method for fabricating a nitride III–V compound semiconductor substrate, comprising the steps of:

growing a first $B_wAl_xGa_yIn_zN$ layer (where $0 \leq w \leq 1$, $0 \leq x \leq 1$, $0 \leq y \leq 1$, $0 \leq y \leq 1$ and $w+x+y+z=1$) on a substrate by first vapor deposition at a growth rate not higher than 4 $\mu$m/h;

growing a second $B_wAl_xGa_yIn_zN$ layer (where $0 \leq w \leq 1$, $0 \leq x \leq 1$, $0 \leq y \leq 1$, $0 \leq y \leq 1$ and $w+x+y+z=1$) on the first $B_wAl_xGa_yIn_zN$ layer by second vapor deposition at a growth rate higher than 4 $\mu$m/h and not higher than 200 $\mu$m/h; and removing the substrate.

The first vapor deposition used in the invention may be metal organic chemical vapor deposition or molecular beam epitaxy, and the second vapor deposition may be hydride vapor phase epitaxy or metal organic chemical vapor deposition. Exemplary combinations of the first vapor deposition and the second vapor deposition are: the first vapor deposition being metal organic chemical vapor deposition and the second vapor deposition being hydride vapor phase epitaxy; both the first vapor deposition and the second vapor deposition being metal organic chemical vapor deposition; the first vapor deposition being molecular beam epitaxy and the second vapor deposition being hydride vapor phase epitaxy; and the first vapor deposition being molecular beam epitaxy and the second vapor deposition being metal organic chemical vapor deposition.

The first $B_wAl_xGa_yIn_zN$ layer is preferably as thick as preventing surface roughness or cracks, promising a good crystallographic property and not requiring a long time for the growth. For example, the thickness of the first $B_wAl_xGa_yIn_zN$ layer ranges from 0.3 to 10 μm, and preferably 3±2 μm or 1 to 5 μm.

The first $B_wAl_xGa_yIn_zN$ layer and the second $B_wAl_xGa_yIn_zN$ layer may be of an n-type or a p-type, if necessary. Typically usable as an n-type impurity is at least one element selected from the group consisting of C, Si, Ge and Sn, which are group IV elements, and S, Se and Te, which are group VI elements. Typically usable as a p-type impurity is at least one element selected from the group consisting of C, Si, Ge and Sn, which are group IV elements, and Be, Mg, Ca, Zn and Cd, which are group II elements. Any of simple elements, organic compounds or hydrides may be used as the material of the n-type or p-type impurity.

Also for B, Al Ga and In that are group III elements, any of simple elements or organic metal compounds containing group III elements may be used.

Hydride gases especially usable for hydride vapor phase epitaxy are HCl, HF, HBr and HI, for example.

Materials of N usable for growing the first $B_wAl_xGa_yIn_zN$ layer and the second $B_wAl_xGa_yIn_zN$ layer by hydride vapor phase epitaxy include ammonia, hydrazine-based materials expressed by the general formula $N_2R_4$ (where R is H or an alkyl radical), such as hydrozine, dimethyl hydrazine and monomethyl hydrazine, and organic amine. Examples of organic amine are primary amine such as propyl amine, isopropyl amine, butyl amine, isobutyl amine and tertiary butyl amine, secondary butyl amine, secondary amine such as dipropyl amine, diisopropyl amine, dibutyl amine, diisobutyl amine, ditertiary butyl amine and secondary butyl amine, and tertiary amine such as tri-propyl amine, tri-isopropyl amine, tri-butyl amine, tri-isobutyl amine, tri-tertiary butyl amine, tri-secondary butyl amine, tri-aryl amine, tri-ethyl amine, di-isopropyl methylamine, di-propyl methylamine, di-butyl methylamine, di-isobutyl methylamine, di-secondary butyl methyl amine, di-tert-butyl methyl amine, and so forth.

In order to prevent, for example, that defects or cracks be made in the second $B_xAl_xGa_yIn_zN$ layer due to a difference in thermal expansion coefficient between the second $B_wAl_xGa_yIn_zN$ layer and the substrate during growth of the second $B_wAl_xGa_yIn_zN$ layer, the thickness of the substrate is preferably less than or equal to the thickness of the $B_wAl_xGa_yIn_zN$ layer at least during the growth of the second $B_wAl_xGa_yIn_zN$ layer. More specifically, if a substrate thicker than the second $B_wAl_xGa_yIn_zN$ layer is used, the substrate may be etched or lapped from the bottom surface to reduce its thickness equal to or less than the thickness of the second $B_wAl_xGa_yIn_zN$ layer after growing the first $B_wAl_xGa_yIn_zN$ layer and before growing the second $B_wAl_xGa_yIn_zN$ layer. Alternatively, a substrate originally having a thickness less than or equal to the thickness of the second $B_wAl_xGa_yIn_zN$ layer. Typically, the thickness of the substrate at least during the growth of the second $B_wAl_xGa_yIn_zN$ layer is 400 μm or less, for example, and more preferably, 200 μm or less.

To obtain a substrate consisting of nitride III–V compound semiconductors, the substrate is removed by etching or lapping after the second $B_wAl_xGa_yIn_zN$ layer is grown. In this case, for the purpose of preventing any damages or contamination on the surface of the second $B_wAl_xGa_yIn_zN$ layer, the second $B_wAl_xGa_yIn_zN$ layer is preferably covered by a protective film before the substrate is removed.

The surface of the first $B_wAl_xGa_yIn_zN$ layer or the second $B_wAl_xGa_yIn_zN$ layer is polished or etched to obtain a good surface condition. Whichever of the first $B_wAl_xGa_yIn_zN$ layer or the second $B_wAl_xGa_yIn_zN$ layer should be polished or etched depends upon whether nitride III–V compound semiconductor layers for a semiconductor device be grown on the first layer or the second layer.

Usable as the substrate are, for example, a sapphire substrate, silicon carbide substrate, or magnesium aluminum spinel substrate.

According to a third aspect of the invention, there is provided a method for growing nitride III–V compound semiconductor layers comprising the steps of:

growing a first GaN layer on a sapphire substrate at a growth rate not higher than 4 μm/h; and growing a second GaN layer on the first GaN layer by hydride VPE at a growth rate higher than 4 μm/h and not higher than 200 μm/h.

According to a fourth aspect of the invention, there is provided a method for growing nitride III–V compound semiconductor layers comprising the steps of:

growing a first GaN layer as thick as 0.3 μm to 10 μm on a sapphire substrate at a growth rate not higher than 4 μm/h; and growing a second GaN layer on the first GaN layer by hydride VPE at a growth rate higher than 4 μm/h and not higher than 200 μm/h.

According to a fifth aspect of the invention, there is provided a method for growing nitride III–V compound semiconductor layers comprising the steps of:

growing a nitride III–V compound semiconductor layer as thick as 0.3 μm to 10 μm on a sapphire substrate by one of MOCVD and MBE; and growing a second nitride III–V compound semiconductor layer on the first III–V compound semiconductor layer by hydride VPE.

According to the invention summarized above, since the first $B_wAl_xGa_yIn_zN$ layer (where $0 \leq w \leq 1, 0 \leq x \leq 1, 0 \leq y \leq 1, 0 \leq y \leq 1$ and w+x+y+z=1) is grown on the substrate by the first vapor deposition at a growth rate not higher than 4 μm/h, the first $B_wAl_xGa_yIn_zN$ layer has an excellent quality with a good crystallographic property without surface roughness or cracks. Accordingly, since the second $B_wAl_xGa_yIn_zN$ layer (where $0 \leq w \leq 1, 0 \leq x \leq 1, 0 \leq y \leq 1, 0 \leq y \leq 1$ and w+x+y+z=1) is grown on the first $B_wAl_xGa_yIn_zN$ layer by the second vapor deposition at a speed higher than 4 μm/h and not higher than 200 μm/h, the second $B_wAl_xGa_yIn_zN$ layer of an excellent quality with a good crystallographic property without surface roughness or cracks like the first $B_wAl_xGa_yIn_zN$ layer can be grown to a sufficient thickness in a short time. Additionally, by subsequently removing the substrate used for the growth of the first $B_wAl_xGa_yIn_zN$ layer and the second $B_wAl_xGa_yIn_zN$ layer, a $B_wAl_xGa_yIn_zN$ substrate, such as GaN substrate, for example, can be made with a high productivity.

The above, and other, objects, features and advantage of the present invention will become readily apparent from the following detailed description thereof which is to be read in connection with the accompanying drawings.

BRIEF DESCRIPTION OF THE DRAWINGS

FIGS. 4A, 4B, 4C, 4D and 4E are cross-sectional views for explaining a process for manufacturing a $Ga_{1-x}In_xN$ substrate according to a third embodiment of the invention;

DETAILED DESCRIPTION OF THE PREFERRED EMBODIMENTS

Some embodiments of the invention are described below with reference to the drawings.

First explained is a process for fabricating a GaN substrate according to the first embodiment of the invention.

FIGS. 1A through 1E are cross-sectional views of the GaN substrate in different steps of the manufacturing process according to the first embodiment.

Figure 1A:
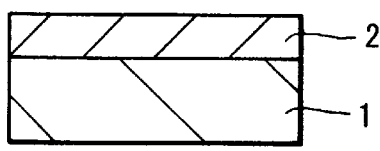
FIGS. 1A, 1B, 1C, 1D and 1E are cross-sectional views for explaining a process for manufacturing a GaN substrate according to a first embodiment of the invention.

In the first embodiment, first as shown in FIG. 1A, a c-plane sapphire substrate 1 as thick as 450 nm, for example, is inserted in a reactive tube of a MOCVD apparatus (not shown). Thereafter, a mixed gas containing $H_2$ and $N_2$, used as a carrier gas, is supplied into the reactive tube to thermally clean the surface of the c-plane sapphire substrate 1 by annealing for 20 minutes at 1050° C., for example. After that, the substrate temperature is decreased to 510° C., for example, and ammonia ($NH_3$) as a N material and tri-methyl gallium (TMG, $Ga(CH_3)_3$) as a Ga material are supplied into the reactive tube to grow a GaN buffer layer (not shown) on the c-plane sapphire substrate. After that, the supply of TMG into the reactive tube is stopped, and the growth temperature is elevated to approximately 1000° C., for example, while continuing the supply of $NH_3$. Thereafter, TMG is again supplied into the reactive tube to grow the GaN layer 2 at a speed not higher than 4 $\mu$m/h. The GaN layer 2 is grown up to the thickness of 3 $\mu$m, for example. The GaN layer 2 grown by MOCVD at a growth rate of 4 $\mu$m/h or less has an excellent quality with a good crystallographic property, deterring surface roughness or cracks.

Subsequent to the growth of the GaN layer 2, a S film (not shown) is grown on the GaN layer 2 in the reactive tube, using di-ethyl sulphur (DES, $S(C_2H_5)_2$) as a material, to cover the surface of the GaN layer 2. After that, the c-plane sapphire substrate 1 is taken out from the reactive tube. The GaN layer 2 is thus covered by the S film before the c-plane sapphire substrate 1 is taken out from the reactive tube because the surface of the GaN layer 2 will be contaminated when taken out from the reactive tube and exposed to the ambient air without the protective film and another GaN layer to be grown later on the GaN layer 2 by hydride VPE will be adversely affected.

Figure 1B:
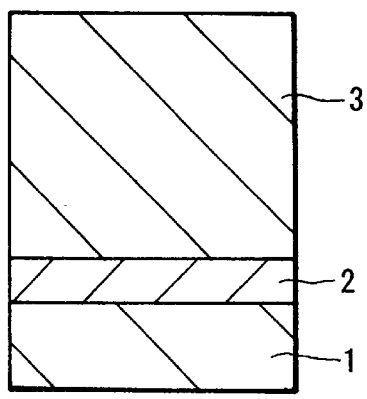

After that, the c-plane sapphire substrate 1 is lapped from the bottom surface to reduce the thickness of the c-plane sapphire substrate 1 to a value equal to or less than the thickness of another GaN layer to be grown by hydride VPE in the next step. This is done to prevent any defects or cracks being made in the GaN layer due to a difference in thermal expansion coefficient between the c-plane sapphire substrate 1 and the GaN layer. After that, as shown in FIG. 1B, the GaN layer 3 of a sufficient thickness (for example, as thick as 200 $\mu$m) is homoepitaxially grown on the GaN layer 2 on the c-plane sapphire substrate 1 by hydride VPE.

The growth of the GaN layer 3 is progressed as explained below, using a hydride VPE apparatus shown in FIG. 2. That is, the c-plane sapphire substrate 1 having the GaN layer 2 grown thereon is put on a susceptor 12 set in a reactive tube 11 made of silica glass in the hydride VPE apparatus shown in FIG. 2. The upstream portion of the reactive tube 11 is divided by a partition plate 13 into upper and lower two parts, and a boat 15 containing a simple element material, Ga 14, is put on the partition plate 13 in the upper divisional part. The upper part above the partition plate 13 of the reactive tube 11 can be supplied with HCl gas through a pipe 16 and $N_2$ gas through a pipe 17. The lower part under the partition plate 13 of the reactive tube 11 can be supplied with $NH_3$ gas through a pipe 18 and $N_2$ gas through a pipe 19. The reactive tube 11 is heated by an external heater 20 to provide a temperature gradient in its lengthwise direction. Numerals 21 through 24 denote mass flow controllers for controlling the flow amounts of gases.

Prior to growth of the GaN layer 3, the c-plane sapphire substrate 1 is heated to a growth temperature in the reactive tube 11 to remove the S film from the surface of the GaN layer 2 by evaporation. During the heating process, $NH_3$ gas is supplied into the reactive tube 11 to prevent separation of N from the GaN layer 2.

After the S film is removed, HCl gas and $N_2$ gas as its carrier gas are supplied into the upper part above the partition plate 13 of the reactive tube 11, and $NH_3$ gas and $N_2$ gas as its carrier gas are supplied to the lower part under the partition plate 13 of the reactive gas 11. As a result, in the upper part above the partition plate 13 of the reactive tube 11, GaCl is produced by interaction of HCl and Ga 14, and GaCl and $NH_3$ supplied into the lower part under the partition plate 13 of the reactive tube 11 meet above the susceptor 12 and cause the GaN layer 3 to grow on the GaN layer 2 on the c-plane sapphire substrate 1. The growth rate for growing the GaN layer 3 is determined as large as possible within the range larger than 4 $\mu$m/h and not exceeding 200 $\mu$m/h as long as causing no other difficulties. A typical example of growth conditions is: HCl flow rate being 20 $\mu$mol/min, $NH_3$ flow rate being 1 SLM, $N_2$ flow rate being 0.55 SLM, the temperature around Ga 14 in the boat 15 being 800° C., and the temperature of and around the c-plane sapphire substrate 1 put on the susceptor 12 being 980° C. Gases supplied into the reactive tube 11 are finally sent to and processed in a unit to remove harmful substances therefrom.

Figure 1C:
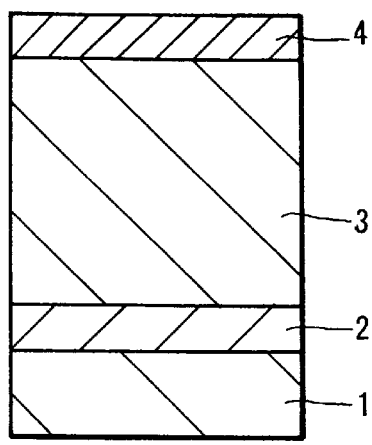

Then, the c-plane sapphire substrate 1 having the GaN layer 3 grown thereon is taken out from the reactive tube 11, and, as shown in FIG. 1C, a $SiO_2$ film 4 is formed on the GaN layer 3 by CVD, for example, to cover the surface of the GaN layer 3.

Figure 1D:
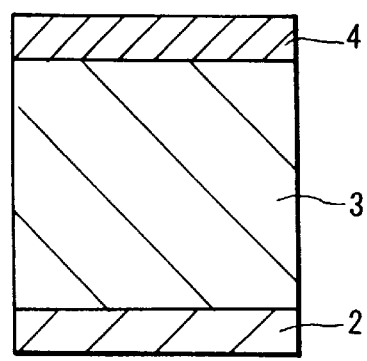

After that, as shown in FIG. 1D, the c-plane sapphire substrate 1 is etched off by wet etching, for example. The wet etching is done at 285° C., using a $H_3PO_4$—$H_2SO_4$-based etchant (such as $H_3PO_4$:$H_2SO_4$=1:1), for example. Additionally, the $SiO_2$ film 4 is etched off by wet etching using a HF-based etchant, for example.

The surface of the GaN layer 3 or the surface of the GaN layer 2, which is used as the growth surface, is next processed into a flat and high-quality surface condition by etching or polishing using vapor phase etching, liquid phase chemical etching, mechanical-chemical polishing, or the like.

Figure 1E:
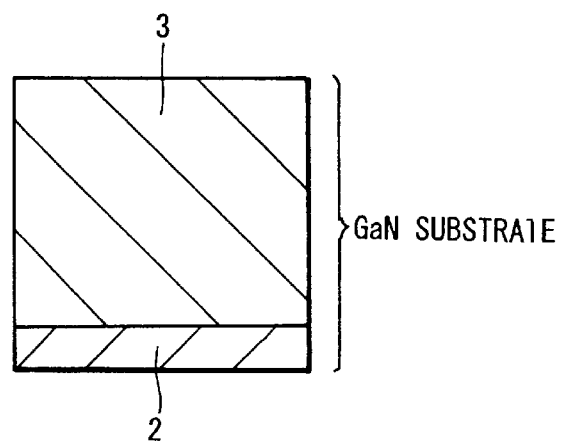

As a result, a single-crystal GaN substrate having the thin GaN layer 2 grown by MOCVD and the sufficiently thick GaN layer 3 grown by hydride VPE, as shown in FIG. 1E, can be obtained.

According to the first embodiment, since the GaN layer 2 is grown thin on the c-plane sapphire substrate 1 by MOCVD at a growth rate of 4 μm/h or less, it is prevented that surface roughness or cracks occur in the GaN layer 2, and a good crystallographic property is promised. Further, since the GaN layer 3 as the major part of the substrate is grown sufficiently thick on the high-quality GaN layer 2 by hydride VPE at a growth rate higher than 4 μm/h and not exceeding 200 μm/h, it is prevented that surface roughness or cracks occur in the GaN layer 3, and a good crystallographic property is promised. Therefore, when the c-plane sapphire substrate 1 is removed later, a high-quality GaN substrate can be obtained. Moreover, since hydride VPE having a very high growth rate is used for growing the thick GaN layer 3 forming the major part of the GaN substrate, the time required for growing the GaN layer 3 as thick as 200 μm, for example, is as short as several hours, for example, although depending on the growth rate actually used, and this results in a high productivity. Additionally, the GaN substrate can be made as large as two inches or more in diameter, depending upon the diameter of the c-plane sapphire substrate 1 used for the growth.

The GaN substrate, thus obtained, is suitable for use in fabricating various kinds of semiconductor devices using nitride-III–V compound semiconductors. That is, by growing nitride III–V compound semiconductor layers on the GaN substrates by MOCVD or any other appropriate method, various kinds of semiconductor devices can be made. Especially for fabricating semiconductor lasers by growth of nitride III–V compound semiconductor layers on the GaN substrate, cavity end surfaces of semiconductor lasers can be made easily by simply cleaving these nitride III–V compound semiconductor layers together with the GaN substrate. Moreover, if the GaN layers 2 and 3 are made to be of an n-type, then an n-type GaN substrate can be obtained; and if the GaN layers 2 and 3 are made to be of a p-type, then a p-type GaN substrate can be obtained. In these cases, an n-type electrode or p-type electrode can be made on the bottom surface of the GaN substrate, and semiconductor lasers with a high reliability can be fabricated with a high yield.

Next explained is the second embodiment of the invention.

Figure 3:
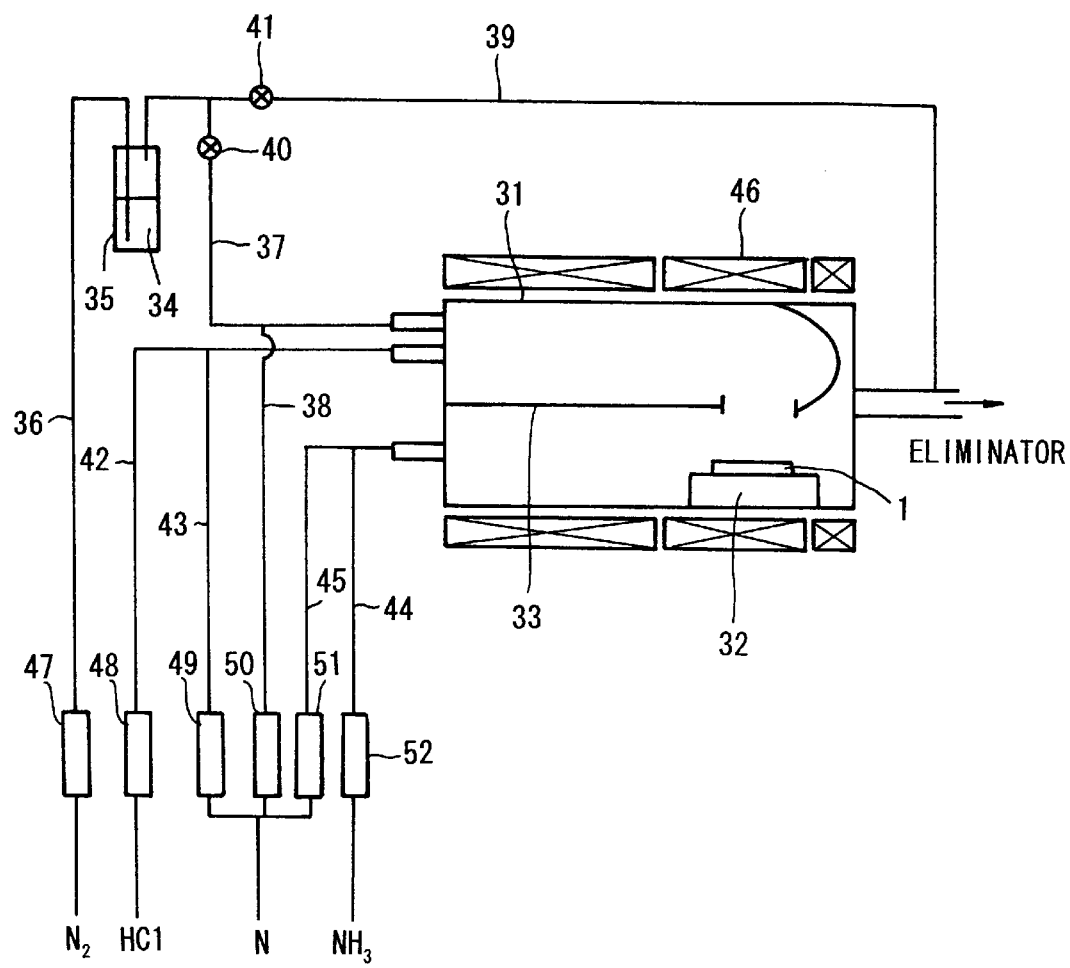
FIG. 3 is a schematic diagram of a hydride VPE apparatus used for fabricating a GaN substrate according to a second embodiment of the invention.

The second embodiment uses a different hydride VPE apparatus shown in FIG. 3 for growing the GaN layer 3 forming the major part of the GaN substrate by hydride VPE. In the other respects, the second embodiment is the same as the first embodiment, and explanation thereof is omitted here.

Figure 2:
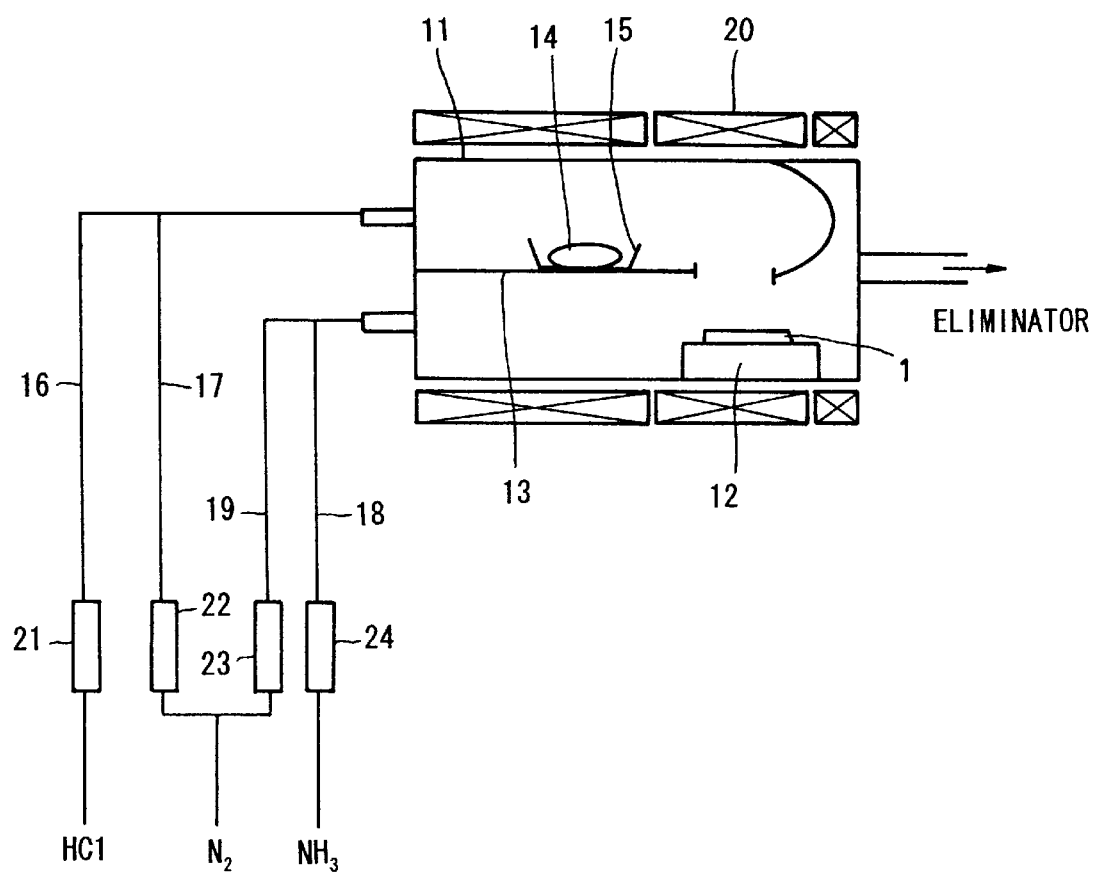
FIG. 2 is a schematic diagram of a hydride VPE apparatus used for fabricating the GaN substrate according to the first embodiment of the invention.

As shown in FIG. 3, the c-plane sapphire substrate 1 having the GaN layer 2 grown thereon is put on a susceptor 32 set in a reactive tube 31 made of silica glass in the hydride VPE apparatus shown in FIG. 2. The upstream portion of the reactive tube 31 is divided by a partition plate 33 into upper and lower two parts. TMG 34, an organic metal compound, is used as the Ga material, and $N_2$ gas is supplied as a carrier gas into a bubbler 35 containing TMG 34 through a pipe 36 to generate TMG gas by bubbling. The upper part above the partition plate 33 of the reactive tube 31 can be supplied with the TMG gas through a pipe 37 and $N_2$ gas through a pipe 38. Numeral 39 denotes a bypass pipe. The path of TMG gas from the bubbler 35 is switched between the pipe 37 and the bypass tube 39 by opening and closing valves 40 and 41. The upper part above the partition plate 33 of the reactive tube 31 can be further supplied with HCl gas through a pipe 42 and $N_2$ gas as a carrier gas through a pipe 43. On the other hand, the lower part under the partition plate 33 of the reactive tube 31 can be supplied with $NH_3$ gas through a pipe 44 and $N_2$ gas as a carrier gas through a pipe 45. The reactive tube 31 is heated by an external heater 46 to provide a temperature gradient in its lengthwise direction. Numerals 47 through 52 denote mass flow controllers for controlling the flow amounts of gases.

The second embodiment have the same advantages as those of the first embodiment.

Next explained is the third embodiment of the invention. Although the first and second embodiments have been explained as fabricating GaN substrates, the third embodiment is directed to fabrication of a $Ga_{1-x}In_xN$ substrate (where $0<x\leq1$).

As shown in FIG. 4A, in the same manner as the first embodiment, a $Ga_{1-x}In_xN$ layer 62 is grown on a c-plane sapphire substrate 61 by MOCVD, for example, at a growth rate not higher than 4 μm/h. In the $Ga_{1-x}In_xN$ layer 62, $0<x\leq1$.

Subsequent to the growth of the $Ga_{1-x}In_xN$ layer 62, a S film (not shown) is grown on the $Ga_{1-x}In_xN$ layer 62 in an reactive tube of a MOCVD apparatus, using DES as a material, to cover the surface of the $Ga_{1-x}In_xN$ layer 62. After that, the c-plane sapphire substrate 61 is taken out from the reactive tube. The reason why the $Ga_{1-x}In_xN$ layer 62 is thus covered by the S film before the c-plane sapphire substrate 61 is taken out from the reactive tube is the same as the reason why the surface of the GaN layer 2 is covered by the S film before the c-plane sapphire substrate 1 is taken out from the reactive tube in the first embodiment.

After that, the c-plane sapphire substrate 61 is lapped from the bottom surface to reduce the thickness of the c-plane sapphire substrate 61 to a value equal to or less than the thickness of another $Ga_{1-x}In_xN$ layer to be grown by hydride VPE in the next step. This is done to prevent any defects or cracks being made in the $Ga_{1-x}In_xN$ layer due to a difference in thermal expansion coefficient between the c-plane sapphire substrate 61 and the $Ga_{1-x}In_xN$ layer. After that, as shown in FIG. 4B, the $Ga_{1-x}In_xN$ layer 63 of a sufficient thickness (for example, as thick as 200 μm) is grown on the $Ga_{1-x}In_xN$ layer 62 on the c-plane sapphire substrate 61 by hydride VPE.

Figure 5:
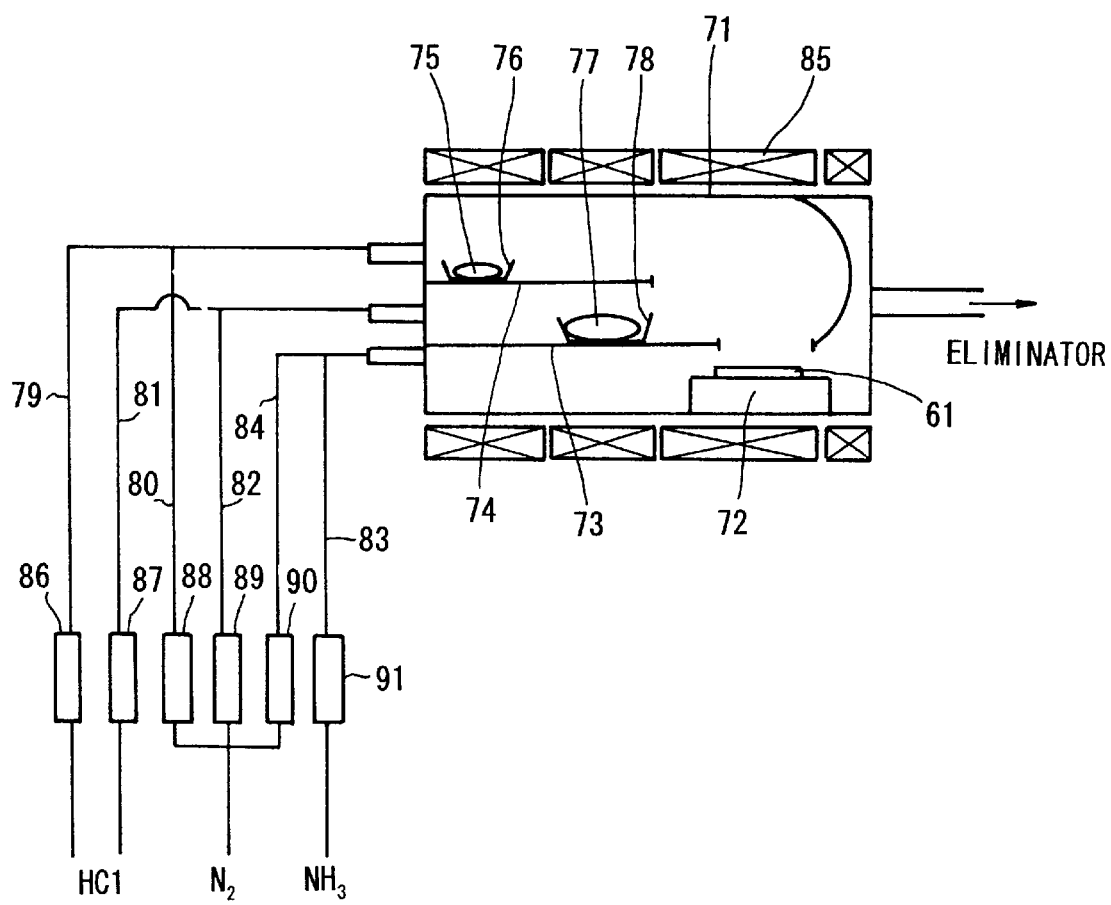
FIG. 5 is a schematic diagram of a hydride VPE apparatus used for fabricating the $Ga_{1-x}In_xN$ substrate according to the third embodiment of the invention.

The growth of the $Ga_{1-x}In_xN$ layer 63 is progressed as explained below, using a hydride VPE apparatus shown in FIG. 5. That is, the c-plane sapphire substrate 61 having the $Ga_{1-x}In_xN$ layer 62 grown thereon is put on a susceptor 72 set in a reactive tube 71 made of silica glass in the hydride VPE apparatus shown in FIG. 5. The upstream portion of the reactive tube 71 is divided by partition plates 73 and 74 into three parts. A boat 76 containing a simple element material, In 75, is put on the partition plate 73 in the uppermost divisional part, and a boat 78 containing a simple element material, Ga 77, is put on the partition plate 74 in the middle divisional portion. The uppermost part above the partition plate 73 of the reactive tube 71, in which the boat 76 is set, can be supplied with HCl gas through a pipe 79 and $N_2$ gas as a carrier gas through a pipe 80. The part of the reactive tube 71 between the partition plates 73 and 74 can be supplied with HCl gas through a pipe 81 and $N_2$ gas as a carrier gas through a pipe 82. The lowest portion of the reactive tube 71 can be supplied with $NH_3$ gas through a pipe 83 and $N_2$ gas as a carrier gas through a pipe 84. The reactive tube 71 is heated by an external heater 85 to provide a temperature gradient in its lengthwise direction. Numerals 86 through 91 denote mass flow controllers for controlling the flow amounts of gases.

Prior to growth of the $Ga_{1-x}In_xN$ layer 63, the c-plane sapphire substrate 61 is heated to a growth temperature in the reactive tube 71 to remove the S film from the surface of the $Ga_{1-x}In_xN$ layer 62 by evaporation. During the heating process, $NH_3$ gas is supplied into the reactive tube 71 to prevent separation of N from the $Ga_{1-x}In_xN$ layer 62.

After the S film is removed, HCl gas and $N_2$ gas as its carrier gas are supplied into the upper part above the partition plate 74 of the reactive tube 71, $NH_3$ gas and $N_2$ gas as its carrier gas are supplied to the part of the reactive tube 71 between the partition plates 73 and 74, and $NH_3$ gas and $N_2$ gas as its carrier gas are supplied into the lowest part of the reactive tube 71 under the partition plate 73. As a result, InCl is produced in the upper part of the reactive tube 71 above the partition plate 74 by interaction of HCl and In 75, and GaCl is produced in the middle part of the reactive tube 71 between the partition plates 73 and 74 by interaction of HCl and Ga 77. InCl, GaCl and $NH_3$ supplied into the lowest part of the reactive tube 71 under the partition plate 74 meet above the susceptor 72 and cause the $Ga_{1-x}In_xN$ layer 63 to grow on the $Ga_{1-x}In_xN$ layer 62 on the c-plane sapphire substrate 61. The growth rate for growing the $Ga_{1-x}In_xN$ layer 63 is determined as large as possible within the range larger than 4 $\mu$m/h and not exceeding 200 $\mu$m/h as long as causing no other difficulties. A typical example of growth conditions is: HCl flow rate being 20 $\mu$mol/min, $NH_3$ flow rate being 1 SLM, $N_2$ flow rate being 0.55 SLM, the temperature around In 75 in the boat 76 being 750° C., the temperature around Ga 77 in the boat 78 being 800° C., and the temperature of and around the c-plane sapphire substrate 61 put on the susceptor 72 being 980° C. Gases supplied into the reactive tube 71 are finally sent to and processed in a unit to remove harmful substances therefrom.

Then, the c-plane sapphire substrate 61 having the $Ga_{1-x}In_xN$ layer 63 grown thereon is taken out from the reactive tube 71, and, as shown in FIG. 4C, a $SiO_2$ film 64 is formed on the $Ga_{1-x}In_xN$ layer 63 by CVD, for example, to cover the surface of the $Ga_{1-x}In_xN$ layer 63.

After that, as shown in FIG. 4D, the c-plane sapphire substrate 61 is etched off by wet etching, for example. The wet etching is done at 285° C., using a $H_3PO_4$—$H_2SO_4$-based etchant (such as $H_3PO_4$:$H_2SO_4$=1:1), for example. Additionally, the $SiO_2$ film 64 is etched off by wet etching using a HF-based etchant, for example.

The surface of the $Ga_{1-x}In_xN$ layer 63 or the surface of the $Ga_{1-x}In_xN$ layer 62, which is used as the growth surface, is next processed into a flat and high-quality surface condition by etching or polishing using vapor phase etching, liquid phase chemical etching, mechanical-chemical polishing, or the like.

As a result, a single-crystal $Ga_{1-x}In_xN$ substrate having the thin $Ga_{1-x}In_xN$ layer 62 grown by MOCVD and the sufficiently thick $Ga_{1-x}In_xN$ layer 63 grown by hydride VPE, as shown in FIG. 4E, can be obtained.

According to the third embodiment, since the $Ga_{1-x}In_xN$ layer 62 is grown thin on the c-plane sapphire substrate 61 by MOCVD at a growth rate of 4 $\mu$m/h or less, it is prevented that surface roughness or cracks occur in the $Ga_{1-x}In_xN$ layer 62, and a good crystallographic property is promised. Further, since the $Ga_{1-x}In_xN$ layer 63 as the major part of the substrate is grown sufficiently thick on the high-quality $Ga_{1-x}In_xN$ layer 62 by hydride VPE at a growth rate higher than 4 $\mu$m/h and not exceeding 200 $\mu$m/h, it is prevented that surface roughness or cracks occur in the $Ga_{1-x}In_xN$ layer 63, and a good crystallographic property is promised. Therefore, when the c-plane sapphire substrate 61 is removed later, a high-quality $Ga_{1-x}In_xN$ substrate can be obtained. Moreover, since hydride VPE having a very high growth rate is used for growing the thick $Ga_{1-x}In_xN$ layer 63 forming the major part of the GaN substrate, the time required for growing a $Ga_{1-x}In_xN$ substrate as thick as 200 $\mu$m, for example, is as short as several hours, for example, although depending on the growth rate actually used, and this results in a high productivity. Additionally, the $Ga_{1-x}In_xN$ substrate can be made as large as two inches or more in diameter, depending upon the diameter of the c-plane sapphire substrate 61 used for its growth.

The $Ga_{1-x}In_xN$ substrate, thus obtained, is suitable for use in fabricating various kinds of semiconductor devices using nitride III–V compound semiconductors. That is, by growing nitride III–V compound semiconductor layers on the $Ga_{1-x}In_xN$ substrates by MOCVD or any other appropriate method, various kinds of semiconductor devices can be made. Especially for fabricating semiconductor lasers by growth of nitride III–V compound semiconductor layers on the $Ga_{1-x}In_xN$ substrate, cavity end surfaces of semiconductor lasers can be made easily by simply cleaving these nitride III–V compound semiconductor layers together with the $Ga_{1-x}In_xN$ substrate. Moreover, if the $Ga_{1-x}In_xN$ layers 62 and 63 are made to be of an n-type, then an n-type $Ga_{1-x}In_xN$ substrate can be obtained; and if the $Ga_{1-x}In_xN$ layers 62 and 63 are made to be of a p-type, then a p-type $Ga_{1-x}In_xN$ substrate can be obtained. In these cases, an n-type electrode or p-type electrode can be made on the bottom surface of the $Ga_{1-x}In_xN$ substrate, and semiconductor lasers with a high reliability can be fabricated with a high yield.

Next explained is the fourth embodiment of the invention. Although the first and second embodiments have been explained as fabricating GaN substrates, and the third embodiment has been explained as fabricating a $Ga_{1-x}In_xN$ substrate, the fourth embodiment is directed to fabricating, more generally, a $B_wAl_xGa_yIn_zN$ substrate (where $0 \leq w \leq 1$, $0 \leq x \leq 1$, $0 \leq y \leq 1$, $0 \leq y \leq 1$ and w+x+y+z=1).

Figure 6A:
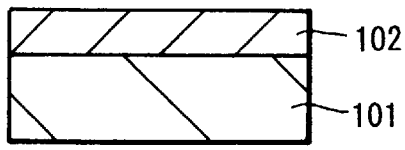
FIGS. 6A, 6B, 6C, 6D and 6E are cross-sectional views for explaining a process for fabricating a $B_wAl_xGa_yIn_zN$ substrate according to a fourth embodiment of the invention.

As shown in FIG. 6A, in the same manner as the first embodiment, a $B_wAl_xGa_yIn_zN$ layer 102 is grown on a c-plane sapphire substrate 101 by MOCVD, for example. In the $B_wAl_xGa_yIn_zN$ layer 102, $0 \leq w \leq 1$, $0 \leq x \leq 1$, $0 \leq y \leq 1$, $0 \leq z \leq 1$, and w+x+y+z=1.

Subsequent to the growth of the $B_wAl_xGa_yIn_zN$ layer 102, a S film (not shown) is grown on the $B_wAl_xGa_yIn_zN$ layer 102 in an reactive tube of a MOCVD apparatus, using DES as a material, to cover the surface of the $B_wAl_xGa_yIn_zN$ layer 102. After that, the c-plane sapphire substrate 101 is taken out from the reactive tube. The reason why the $B_wAl_xGa_yIn_zN$ layer 102 is thus covered by the S film before the c-plane sapphire substrate 101 is taken out from the reactive tube is the same as the reason why the surface of the GaN layer 2 is covered by the S film before the c-plane sapphire substrate 1 is taken out from the reactive tube in the first embodiment.

After that, the c-plane sapphire substrate 101 is lapped from the bottom surface to reduce the thickness of the c-plane sapphire substrate 101 to a value equal to or less than the thickness of another $B_wAl_xGa_yIn_zN$ layer to be grown by hydride VPE in the next step. This is done to prevent any defects or cracks being made in the $B_wAl_xGa_yIn_zN$ layer due to a difference in thermal expansion coefficient between the c-plane sapphire substrate 101 and the $B_wAl_xGa_yIn_zN$ layer.

Figure 6B:
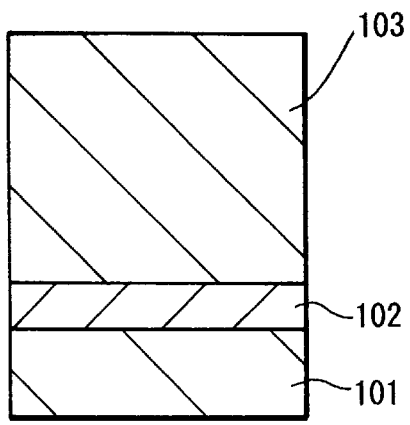

After that, as shown in FIG. 6B, a $B_wAl_xGa_yIn_zN$ layer 103 of a sufficient thickness (for example, as thick as 200 μm) is grown on the $B_wAl_xGa_yIn_zN$ layer 102 on the c-plane sapphire substrate 101 by hydride VPE.

Figure 7:
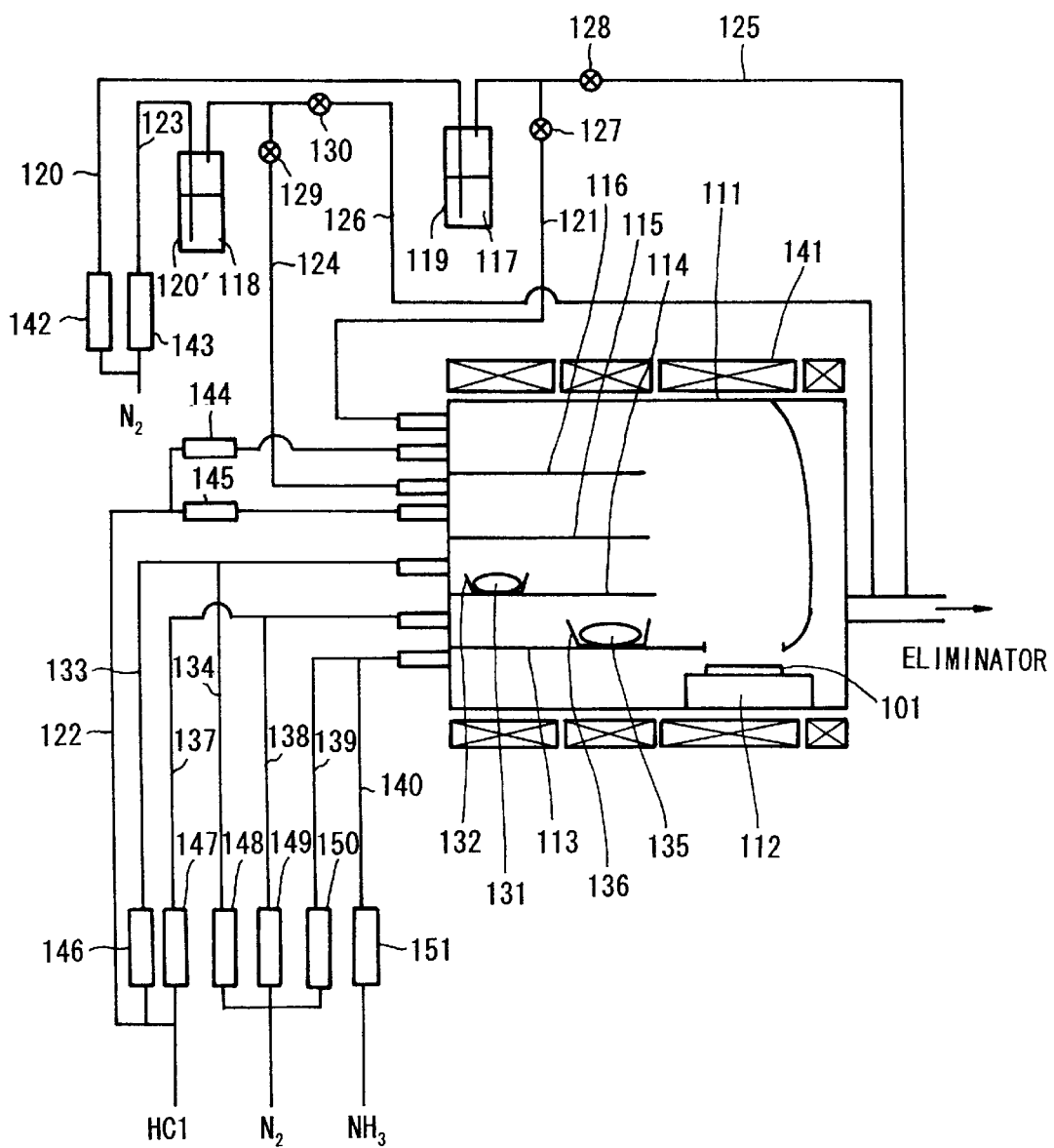
FIG. 7 is a schematic diagram showing a hydride VPE apparatus used for fabricating the $B_wAl_xGa_yIn_zN$ substrate according to a fourth embodiment of the invention.

The growth of the $B_wAl_xGa_yIn_zN$ layer 103 is progressed as explained below, using a hydride VPE apparatus shown in FIG. 7. That is, the c-plane sapphire substrate 101 having the $B_wAl_xGa_yIn_zN$ layer 102 grown thereon is put on a susceptor 112 set in the reactive tube 111 made of silica glass in the hydride VPE apparatus shown in FIG. 7. The upstream portion of the reactive tube 111 is divided into five parts by partition plates 113, 114, 115 and 116. In this embodiment, tri-ethyl boron (TEB, $B(C_2H_5)_3$) 117, one of organic metal compounds, is used as the material of B, and tri-methyl aluminum (TMA, $Al(CH_3)_3$), one of organic metal compounds, is used as the material of Al. $N_2$ gas, as a carrier gas, is supplied into a bubbler 119 containing TEB 117 through a pipe 120, and TEB gas generated by bubbling in the bubbler 119 is supplied to one of the divisional parts of the reactive tube 111 above the partition plate 116. The part of the reactive tube 111 above the partition plate 116 is further supplied with HCl gas through a pipe 122. $N_2$ gas, as a carrier gas, is also supplied into a bubbler 120' containing TMA 118, and TMA gas generated by bubbling in the bubbler 120' is supplied to another part of the reactive tube 111 between the partition plates 115 and 116. Numerals 125 and 126 denote bypass pipes. The flow path of the TEB gas from the bubbler 119 is switched between a pipe 121 and the bypass tube 125 by opening or shutting valves 127 and 128. The flow path of the TMA gas from the bubbler 120' is switched between a pipe 121 and the bypass pipe 126 by opening or shutting valves 129 and 130. A boat 132 containing a simple element material, In 131, is put on the partition plate 114 in another part of the reactive tube 111 between the partition plates 114 and 115. This part of the reactive tube 111 between the partition plates 114 and 115, in which the boat 132 is set, can be supplied with HCl gas through a pipe 133 and $N_2$ gas as a carrier gas through a pipe 134. Another boat 136 containing a simple element material, Ga 135, is put on the partition plate 113 in another part of the reactive tube 111 between the partition plates 113 and 114. This part of the reactive tube 111 between the partition plates 113 and 114, in which the boat 136 is set, can be supplied with HCl gas through a pipe 137 and $N_2$ gas as a carrier gas through a pipe 138.

Another part of the reactive tube 111 under the partition plate 113 can be supplied with $NH_3$ gas through a pipe 139 and $N_2$ gas as a carrier gas through a pipe 140. The reactive tube 111 is heated by an external heater 141 to provide a temperature gradient in its lengthwise direction. Numerals 142 through 151 denote mass flow controllers for controlling the flow amounts of gases.

Prior to growth of the $B_wAl_xGa_yIn_zN$ layer 103, the c-plane sapphire substrate 101 is heated to a growth temperature in the reactive tube 111 to remove the S film on the surface of the $B_wAl_xGa_yIn_zN$ layer 102 by evaporation. During the heating process, $NH_3$ gas is supplied into the reactive tube 111 to prevent separation of N from the $B_wAl_xGa_yIn_zN$ layer 102.

After the S film is removed, TEB gas and HCl gas are supplied into the part of the reactive tube 111 above the partition plate 116; TMA gas and HCl gas are supplied into the part of the reactive tube 111 between the partition plates 115 and 116; HCl gas and $N_2$ gas as its carrier gas are supplied into the part of the reactive tube 111 between the partition plates 114 and 115; HCl gas and $N_2$ gas as its carrier gas are supplied into the part of the reactive tube 111 between the partition plates 113 and 114; and $NH_3$ gas and $N_2$ gas as its carrier gas are supplied to the part of the reactive tube 111 under the partition plate 113. As a result, InCl is produced in the upper part of the reactive tube 111 between the partition plates 114 and 115 by interaction of HCl and In 131, and GaCl is produced in the part of the reactive tube 71 between the partition plates 113 and 114 by interaction of HCl and Ga 135. InCl, GaCl, TEB gas supplied into the part of the reactive tube 111 above the partition plate 116, TMA gas supplied into the part of the reactive gas between the partition plates 115 and 116, and $NH_3$ supplied into the part of the reactive tube 111 under the partition plate 113 meet above the susceptor 112 and cause the $B_wAl_xGa_yIn_zN$ layer 103 to grow on the $B_wAl_xGa_yIn_zN$ layer 102 on the c-plane sapphire substrate 101. The growth rate for growing the $B_wAl_xGa_yIn_zN$ layer 103 is determined as large as possible within the range larger than 4 μm/h and not exceeding 200 μm/h as long as causing no other difficulties. A typical example of growth conditions is: TEM flow rate being 40 μmol/min, TMA flow rate being 50 μmol/min, HCl flow rate being 20 μmol/min, $NH_3$ flow rate being 1 SLM, $N_2$ flow rate being 0.5 SLM, the temperature around In 131 in the boat 132 being 750° C., the temperature around Ga 135 in the boat 136 being 800° C., and the temperature of and around the c-plane sapphire substrate 101 put on the susceptor 112 being 980° C.

Figure 6C:
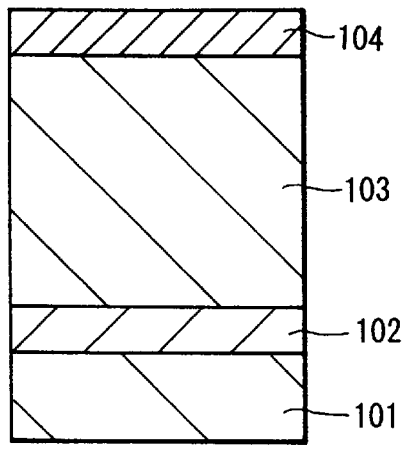

Then, the c-plane sapphire substrate 101 having the $B_wAl_xGa_yIn_zN$ layer 103 grown thereon is taken out from the reactive tube 111, and, as shown in FIG. 6C, a $SiO_2$ film 104 is formed on the $B_wAl_xGa_yIn_zN$ layer 103 by CVD, for example, to cover the surface of the $B_wAl_xGa_yIn_zN$ layer 103.

Figure 6D:
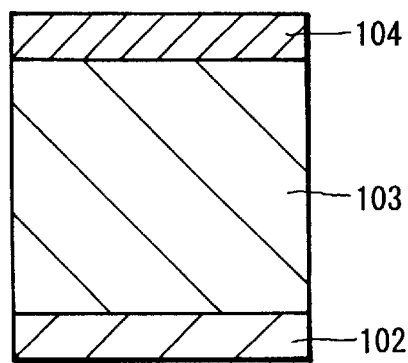

After that, as shown in FIG. 6D, the c-plane sapphire substrate 101 is etched off by wet etching, for example. The wet etching is done at 285° C., using a $H_3PO_4$—$H_2SO_4$-based etchant (such as $H_3PO_4:H_2SO_4=1:1$), for example. Additionally, the $SiO_2$ film 104 is etched off by wet etching using a HF-based etchant, for example.

The surface of the $B_wAl_xGa_yIn_zN$ 103 or the surface of the $B_wAl_xGa_yIn_zN$ 102, which is used as the growth surface, is next processed into a flat and high-quality surface condition by etching or polishing using vapor phase etching, liquid phase chemical etching, chemical mechanical polishing, or the like.

Figure 6E:
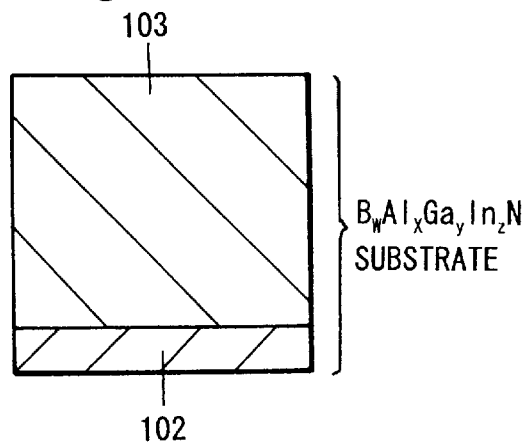

As a result, a single-crystal $B_wAl_xGa_yIn_zN$ substrate having the thin $B_wAl_xGa_yIn_zN$ layer 102 grown by MOCVD and the sufficiently thick $B_wAl_xGa_yIn_zN$ layer 103 grown by hydride VPE, as shown in FIG. 6E, can be obtained.

According to the fourth embodiment, since the $B_wAl_xGa_yIn_zN$ layer 102 is grown thin on the c-plane sapphire substrate 101 by MOCVD at a growth rate of 4 μm/h or less, it is prevented that surface roughness or cracks occur in the $B_wAl_xGa_yIn_zN$ layer 102, and a good crystallographic property is promised. Further, since the $B_wAl_xGa_yIn_zN$ layer 103 as the major part of the substrate is grown sufficiently thick on the high-quality $B_wAl_xGa_yIn_zN$ layer 102 by hydride VPE at a growth rate higher than 4 μm/h and not exceeding 200 μm/h, it is prevented that surface roughness or cracks occur in the $B_wAl_xGa_yIn_zN$ layer 103, and a good crystallographic property is promised. Therefore, when the c-plane sapphire substrate 101 is removed later, a high-quality $B_wAl_xGa_yIn_zN$ substrate can be obtained. Moreover, since hydride VPE having a very high growth rate is used for growing the thick $B_wAl_xGa_yIn_zN$ layer 103 forming the major part of the GaN substrate, the time required for growing a $B_wAl_xGa_yIn_zN$ substrate as thick as 200 μm, for example, is as short as several hours, for example, although depending on the growth rate actually used, and this results in a high productivity. Additionally, the $B_wAl_xGa_yIn_zN$ substrate can be made as large as two inches or more in diameter, depending upon the diameter of the c-plane sapphire substrate 101 used for its growth.

The $B_wAl_xGa_yIn_zN$ substrate, thus obtained, is suitable for use in fabricating various kinds of semiconductor devices using nitride-III–V compound semiconductors. That is, by growing nitride III–V compound semiconductor layers on the $B_wAl_xGa_yIn_zN$ substrates by MOCVD or any other appropriate method, various kinds of semiconductor devices can be made. Especially for fabricating semiconductor lasers by growth of nitride III–V compound semiconductor layers on the $B_wAl_xGa_yIn_zN$ substrate, cavity end surfaces of semiconductor lasers can be made easily by simply cleaving these nitride III–V compound semiconductor layers together with the $B_wAl_xGa_yIn_zN$ substrate. Moreover, if the $B_wAl_xGa_yIn_zN$ layers 102 and 103 are made to be of an n-type, then an n-type $B_wAl_xGa_yIn_zN$ substrate can be obtained; and if the $B_wAl_xGa_yIn_zN$ layers 102 and 103 are made to be of a p-type, then a p-type $B_wAl_xGa_yIn_zN$ substrate can be obtained. In these cases, an n-type electrode or p-type electrode can be made on the bottom surface of the $B_wAl_xGa_yIn_zN$ substrate, and semiconductor lasers with a high reliability can be fabricated with a high yield.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, numerical values, substrates and material gases shown in the explanation of the first through fourth embodiments are only examples, and other numerical values, substrates and material gases may be used, if appropriate. More specifically, instead of the c-plane sapphire substrates 1, 61, 101, sapphire substrates with other plane orientation can be used, and SiC and $MgAl_2$ substrates are also usable. Also usable as the material of Ga is TEG in lieu of TMG.

The first embodiment has been explained as making the c-plane sapphire substrate 1 thinner than the thick GaN layer to be grown later by hydride VPE by lapping the substrate from its bottom surface after the GaN layer 2 is grown on the c-plane sapphire substrate 1; however, a c-plane sapphire substrate 1 originally thinner than the GaN layer 3 may be used to grow both the GaN layer 2 and the GaN layer 3 thereon. The same applies to the third and fourth embodiments.

MBE may be used for growth of the GaN layer 2 in the first and second embodiments, $Ga_xIn_xN$ layer 62 in the third embodiment and $B_wAl_xGa_yIn_zN$ 102 in the fourth embodiment. A SiN film, for example, formed by plasma CVD, for example, may be used instead of $SiO_2$ films 4, 64, 104 as a protective film.

Although the first embodiment has been explained as growing the S film for covering the GaN layer 2 by MOCVD, the S film can be made by immersing the c-plane sapphire substrate 1 having the GaN layer 2 grown thereon in ammonium sulfide $((NH_4)_2S_x)$ for an appropriate duration of time, such as one minute, for example. In this case, after the S film is formed, the substrate is washed by pure water and then dried by blowing $N_2$. The same also applies to the S film for covering the surface of the $Ga_xIn_xN$ layer 62 in the third embodiment and the S film for covering the $B_wAl_xGa_yIn_zN$ 102 in the fourth embodiment.

Further, in some cases, even when the c-plane sapphire substrate 1 is taken out without forming the S film in the reactive tube of the MOCVD in the first embodiment, the surface of the GaN surface 2 can be cleaned by heating the substrate 1 to a growth temperature, for example, in the reactive tube of the hydride VPE apparatus to thermally clean it.

Appropriate inactive gas other than $N_2$ may be used as the carrier gas, and it may include hydrogen, if necessary.

As described above, according to the invention, since the method includes the step of growing the first $B_wAl_xGa_yIn_zN$ layer by the first vapor deposition at a growth rate of 4 μm/h or less and the step of growing the second $B_wAl_xGa_yIn_zN$ layer on the first $B_wAl_xGa_yIn_zN$ layer by the second vapor deposition at a growth rate higher than 4 μm/h and not exceeding 200 μm/h, these first and second $B_wAl_xGa_yIn_zN$ layers can be made with a high quality having a good crystallographic property and no surface roughness or cracks. Additionally, the second $B_wAl_xGa_yIn_zN$ layer can be grown sufficiently thick in a short time. Then, by removing the substrate used for the growth of the first and second $B_wAl_xGa_yIn_zN$ layers, $B_wAl_xGa_yIn_zN$ substrates, such as GaN substrates, for example, can be fabricated with a high productivity.

What is claimed is:

1. A method for growing nitride III–V compound semiconductor layers, comprising the steps of:

growing a first $B_wAl_xGa_yIn_zN$ layer (where $0 \leq w \leq 1$, $0 \leq x \leq 1$, $0 \leq y \leq 1$, $0 \leq y \leq 1$ and w+x+y+z=1) on a sacrificial substrate by first vapor deposition at a growth rate not higher than 4 μm/h, the sacrificial substrate being selected from the group consisting of a sapphire substrate, a silicon carbide substrate or a magnesium aluminum spinel substrate;

growing a second $B_wAl_xGa_yIn_zN$ layer (where $0 \leq w \leq 1$, $0 \leq x \leq 1$, $0 \leq y \leq 1$, $0 \leq y \leq 1$ and w+x+y+z=1) on said first $B_wAl_xGa_yIn_zN$ layer by second vapor deposition at a growth rate higher than 4 μm/h and not higher than 200 μm/h and wherein the thickness of said sacrificial substrate is not thicker than 400 μm at least during the growth of said second $B_wAl_xGa_yIn_zN$ layer; and removing said sacrificial substrate.

2. The method for growing nitride III–V compound semiconductor layers according to claim 1 wherein said first vapor deposition is metal organic chemical vapor deposition, and said second vapor deposition is hydride vapor phase epitaxy.

3. The method for growing nitride III–V compound semiconductor layers according to claim 1 wherein both said first vapor deposition and said second vapor deposition are metal organic chemical vapor deposition.

4. The method for growing nitride III–V compound semiconductor layers according to claim 1 wherein said first vapor deposition is molecular beam epitaxy, and said second vapor deposition is hydride vapor phase epitaxy.

5. The method for growing nitride III–V compound semiconductor layers according to claim 1 wherein said first vapor deposition is molecular beam epitaxy, and said second vapor deposition is metal organic chemical vapor deposition.

6. The method for growing nitride III–V compound semiconductor layers according to claim 1 wherein said first $B_wAl_xGa_yIn_zN$ layer is as thick as 0.3 to 10 μm.

7. The method for growing nitride III–V compound semiconductor layers according to claim 1 wherein said first $B_wAl_xGa_yIn_zN$ layer is as thick as 1 to 5 μm.

8. The method for growing nitride III–V compound semiconductor layers according to claim 1 wherein said first $B_wAl_xGa_yIn_zN$ layer and said second $B_wAl_xGa_yIn_zN$ layer are of an n-type, and each contain as an n-type impurity selected from the group consisting of C, Si, Ge, Sn, S, Se and Te.

9. The method for growing nitride III–V compound semiconductor layers according to claim 1 wherein said first $B_wAl_xGa_yIn_zN$ layer and said second $B_wAl_xGa_yIn_zN$ layer are of a p-type, and each contain as a p-type impurity selected from the group consisting of C, Si, Ge, Sn, Be, Mg, Ca, Zn and Cd.

10. The method for growing nitride III–V compound semiconductor layers according to claim 8 wherein the material of said n-type impurity is a single element, an organic compound or a hydride.

11. The method for growing nitride III–V compound semiconductor layers according to claim 9 wherein the material of said p-type impurity is a single element, an organic compound or a hydride.

12. The method for growing nitride III–V compound semiconductor layers according to claim 1 wherein materials of B, Al, Ga and In which are group III elements are single elements or organic metal compounds containing said group III elements.

13. The method for growing nitride III–V compound semiconductor layers according to claim 1 wherein the thickness of said substrate is not thicker than the thickness of said second $B_wAl_xGa_yIn_zN$ layer at least during the growth of said second $B_wAl_xGa_yIn_zN$ layer.

14. The method for growing nitride III–V compound semiconductor layers according to claim 1 wherein the thickness of said substrate is not thicker than 200 $\mu$m at least during the growth of said second $B_wAl_xGa_yIn_zN$ layer.

15. The method for growing nitride III–V compound semiconductor layers according to claim 1 wherein said first $B_wAl_xGa_yIn_zN$ layer and said second $B_wAl_xGa_yIn_zN$ layer are GaN layers.

16. A method for fabricating a nitride III–V compound semiconductor substrate, comprising the steps of:

growing a first $B_wAl_xGa_yIn_zN$ layer (where $0 \leq w \leq 1$, $0 \leq x \leq 1$, $0 \leq y \leq 1$, $0 \leq y \leq 1$ and $w+x+y+z=1$) on a sacrificial substrate by first vapor deposition at a growth rate not higher than 4 $\mu$m/h, the sacrificial substrate being selected from the group consisting of a sapphire substrate, a silicon carbide substrate or a magnesium aluminum spinel substrate;

growing a second $B_wAl_xGa_yIn_zN$ layer (where $0 \leq w \leq 1$, $0 \leq x \leq 1$, $0 \leq y \leq 1$, $0 \leq y \leq 1$ and $w+x+y+z=1$) on said first $B_wAl_xGa_yIn_zN$ layer by second vapor deposition at a growth rate higher than 4 $\mu$m/h and not higher than 200 $\mu$m/h and wherein the thickness of said sacrificial substrate is not thicker than 400 $\mu$m at least during the growth of said second $B_wAl_xGa_yIn_zN$ layer; and removing said sacrificial substrate.

17. The method for fabricating a nitride III–V compound semiconductor substrate according to claim 16 wherein said substrate is removed by etching or lapping said substrate.

18. The method for fabricating a nitride III–V compound semiconductor substrate according to claim 16 wherein said second $B_wAl_xGa_yIn_zN$ layer is covered by a protective film before said substrate is removed.

19. The method for fabricating a nitride III–V compound semiconductor substrate according to claim 16 wherein said first $B_wAl_xGa_yIn_zN$ or said second $B_wAl_xGa_yIn_zN$ layer is polished or etched to form a high-quality surface condition.

20. The method for fabricating a nitride III–V compound semiconductor substrate according to claim 16 wherein said first $B_wAl_xGa_yIn_zN$ and said second $B_wAl_xGa_yIn_zN$ layer are GaN layers.

21. A method for growing nitride III–V compound semiconductor layers comprising the steps of:

growing a first GaN layer on a sacrificial sapphire substrate a growth rate not higher than 4 $\mu$m/h;

growing a second GaN layer on said first GaN layer by hydride vapor phase epitaxy at a growth rate higher than 4 $\mu$m/h and not higher than 200 $\mu$m/h; and removing the sacrificial substrate.

22. A method for growing nitride III–V compound semiconductor layers comprising the steps of:

growing a first GaN layer as thick as 0.3 $\mu$m to 10 $\mu$m on a sacrificial sapphire substrate at a growth rate not higher than 4 $\mu$m/h;

growing a second GaN layer on said first GaN layer by hydride vapor phase epitaxy at a growth rate higher than 4 $\mu$m/h and not higher than 200 $\mu$m/h; and removing the sacrificial substrate.

23. A method for growing nitride III–V compound semiconductor layers comprising the steps of:

growing a nitride III–V compound semiconductor layer as thick as 0.3 $\mu$m to 10 $\mu$m on a sacrificial sapphire substrate by one of metal organic chemical vapor deposition and molecular beam epitaxy;

growing a second nitride III–V compound semiconductor layer on said first III–V compound semiconductor layer by hydride vapor phase epitaxy; and removing the sacrificial substrate.

* * * * *